(12) United States Patent
Zhang et al.

(10) Patent No.: US 10,381,049 B2
(45) Date of Patent: Aug. 13, 2019

(54) DATA STORAGE DEVICE HOUSING COMPONENTS HAVING A POLYMERIC ELEMENT ATTACHED TO A SURFACE THEREOF

(71) Applicant: Seagate Technology LLC, Cupertino, CA (US)

(72) Inventors: Lihong Zhang, Clementi (SG); Xiong Liu, Upper Bukit Timah (SG); Aravind Pitty, Yishun (SG)

(73) Assignee: Seagate Technology LLC, Cupertino, CA (US)

( * ) Notice: Subject to any disclaimer, the term of this patent is extended or adjusted under 35 U.S.C. 154(b) by 5 days.

(21) Appl. No.: 15/675,876

(22) Filed: Aug. 14, 2017

(65) Prior Publication Data

US 2019/0051332 A1   Feb. 14, 2019

(51) Int. Cl.
| | | |
|---|---|---|
| *G11B 33/00* | (2006.01) | |
| *G11B 33/14* | (2006.01) | |
| *H05K 5/06* | (2006.01) | |
| *G11B 25/04* | (2006.01) | |

(52) U.S. Cl.
CPC .......... *G11B 33/142* (2013.01); *G11B 25/043* (2013.01); *G11B 33/1406* (2013.01); *G11B 33/1446* (2013.01); *G11B 33/1466* (2013.01); *H05K 5/06* (2013.01)

(58) Field of Classification Search
CPC ... G11B 33/1446; G11B 33/1466; H05K 5/06
USPC ................................ 360/99.15, 99.21, 99.22
See application file for complete search history.

(56) References Cited

U.S. PATENT DOCUMENTS

| | | | | |
|---|---|---|---|---|
| 4,810,563 | A | * | 3/1989 | DeGree .................. B32B 15/08 428/209 |
| 5,886,851 | A | | 3/1999 | Yamazaki et al. |
| 5,916,671 | A | * | 6/1999 | Dauber ...................... C08J 9/32 428/317.3 |
| 6,023,392 | A | | 2/2000 | Kim |
| 6,320,723 | B1 | | 11/2001 | Bernett |
| 6,351,344 | B1 | | 2/2002 | Krum et al. |
| 6,505,839 | B1 | * | 1/2003 | Nishimuro .............. F16F 9/526 220/241 |
| 6,567,237 | B2 | | 5/2003 | Iwahara et al. |

(Continued)

FOREIGN PATENT DOCUMENTS

| | | | |
|---|---|---|---|
| EP | 1916 458 A1 | * | 4/2008 |
| WO | WO 2017/060344 A1 | * | 4/2017 |

OTHER PUBLICATIONS

"Material and Process Solutions for Hard Disk Drives", 3M Electronic Adhesives and Specialties Department, Engineered Adhesives Division, 2002 (4 pages).

(Continued)

*Primary Examiner* — Jefferson A Evans
(74) *Attorney, Agent, or Firm* — Kagan Binder, PLLC

(57) ABSTRACT

The present disclosure relates to a data storage device housing component (and related data storage devices) that include a polymeric element attached to a surface thereof. The polymeric element includes a polymeric matrix and a plurality of nanofiller elements dispersed within the polymeric matrix to increase the thermal conductivity of the polymeric element as compared to a polymeric element that does not include the plurality of nanofiller elements. Also disclosed are related methods.

18 Claims, 4 Drawing Sheets

(56) References Cited

U.S. PATENT DOCUMENTS

| | | | | |
|---|---|---|---|---|
| 6,961,208 | B2* | 11/2005 | Kant | G11B 25/043 360/900 |
| 7,315,447 | B2 | 1/2008 | Inoue et al. | |
| 7,365,938 | B2 | 4/2008 | Yoo | |
| 8,216,672 | B2 | 7/2012 | Smith et al. | |
| 8,241,542 | B2* | 8/2012 | Perry | B29C 70/64 264/138 |
| 8,873,226 | B1* | 10/2014 | Peters | G06F 1/1613 361/679.01 |
| 2007/0066491 | A1 | 3/2007 | Bicerano et al. | |
| 2009/0072408 | A1* | 3/2009 | Kabir | B82Y 10/00 257/773 |
| 2010/0256280 | A1* | 10/2010 | Bruzda | C08J 3/201 524/404 |
| 2011/0200825 | A1* | 8/2011 | Chakraborty | C09D 1/00 428/412 |
| 2013/0235488 | A1 | 9/2013 | Andrikowich et al. | |
| 2015/0069290 | A1* | 3/2015 | Guo | C09K 5/14 252/75 |
| 2015/0203668 | A1* | 7/2015 | Bedard | C08K 7/04 523/156 |
| 2015/0364409 | A1* | 12/2015 | Fontana | H01L 23/3677 257/692 |
| 2016/0108183 | A1* | 4/2016 | Zhong | C08J 3/2053 524/114 |
| 2017/0068021 | A1* | 3/2017 | Wilson | G02B 5/0242 |
| 2017/0103826 | A1* | 4/2017 | Al-Harthi | H01B 1/04 |
| 2017/0169860 | A1* | 6/2017 | Sudo | G11B 25/043 |
| 2017/0169862 | A1* | 6/2017 | Sudo | G11B 25/043 |
| 2018/0062197 | A1* | 3/2018 | Thiel | H02S 40/44 |
| 2018/0291195 | A1* | 10/2018 | Schulz | C08L 77/00 |
| 2018/0312660 | A1* | 11/2018 | Schulz | C08K 3/38 |
| 2019/0077929 | A1* | 3/2019 | Bicerano | C08K 3/013 |

OTHER PUBLICATIONS

Product Data Sheet for Single-coated adhesive tape SPAP-5030T2, Nitto Denko Corporation, Oct. 2013 (3 pages).
Safety Data Sheet for Aluminum/PET adhesive tape, SPAP-5030T2; Nitto Denko Corporation P020-00011573-0000 (TOY)Article EN, Jul. 4, 2014 (3 pages).
Material Safety Data Sheet for Araldite QAN-TX09, Huntsman Japan K.K., Jul. 21, 2010 (4 pages).
Safety Data Sheet for SA7065SN (UV Curable Resin), (SDS-ID: FL-0281), Dexerials Corporation, prepared on Jun. 26, 2015, revised on Apr. 19, 2016 (4 pages).
Technical Data Sheet for SA7065SN UV curable Form-In-Place Gasket, Dexerials Corporation, Mar. 23, 2017 (4 pages).
Technical Data for UV curable Form-In-Place Gasket Araldite QAN-TX09, Huntsman Japan K.K., Nov. 28, 2012 (6 pages).
Product Safety Data Sheet for Pressure Sensitive Adhesive Label Products, Avery Dennison, Oct. 14, 2014 (3 pages).
Technical Sealing Guide, PORON Urethane | BISCO Silicone Materials, Rogers Corporation, Publication #17-250, retrieved from http://www.rogerscorp.com/documents/2201/designtools/Technical-Design-Guide.pdf (28 pages).
Mieth et al., "Guidance for the identification of polymers in multilayer films used in food contact materials": User guide of selected practices to determine the nature of layers; EUR 27816 EN; doi:10.2788/10593 (2016) (70 pages).
Marquis et al., "Properties of Nanofillers in Polymer", Nanocomposites and Polymers with Analytical Methods, Dr. John Cuppoletti (Ed.), ISBN: 978-953-307-352-1, InTech, Available from: http://www.intechopen.com/books/nanocomposites-and-polymers-with-analytical-methods/properties-of-nanofillers-in-polymer (Aug. 9, 2011) (25 pages).

\* cited by examiner

DATA STORAGE DEVICE HOUSING COMPONENTS HAVING A POLYMERIC ELEMENT ATTACHED TO A SURFACE THEREOF

BACKGROUND

The present disclosure relates to a data storage device housing component and related data storage devices.

SUMMARY

Embodiments of the present disclosure include a data storage device housing component including a polymeric element attached to a surface of the data storage device housing component, wherein the polymeric element includes:
  a) a polymeric matrix; and
  b) a plurality of nanofiller elements dispersed within the polymeric matrix.

Embodiments of the present disclosure also include a data storage device including a housing, wherein the housing includes a polymeric housing element including:
  a) a polymeric matrix; and
  b) a plurality of nanofiller elements dispersed within the polymeric matrix.

Embodiments of the present disclosure also include a method of making a data storage device housing component, the method including providing a polymeric element on a surface of the data storage device housing component, wherein the polymeric element includes:
  a) a polymeric matrix; and
  b) a plurality of nanofiller elements dispersed within the polymeric matrix.

DETAILED DESCRIPTION

The present disclosure relates to thermal management of data storage devices that use electrical power to store and retrieve data. In some embodiments, the thermal management solutions described herein can be applied to a housing of data storage device.

Non-limiting examples of data storage devices include hard disk drives (internal and/or external), solid state drives (external and/or internal), network attached storage (NAS), flash storage devices, and the like. For illustration purposes, an embodiment of the present disclosure is described with respect to a hard disk drive as one type of a data storage device.

Figure 1:
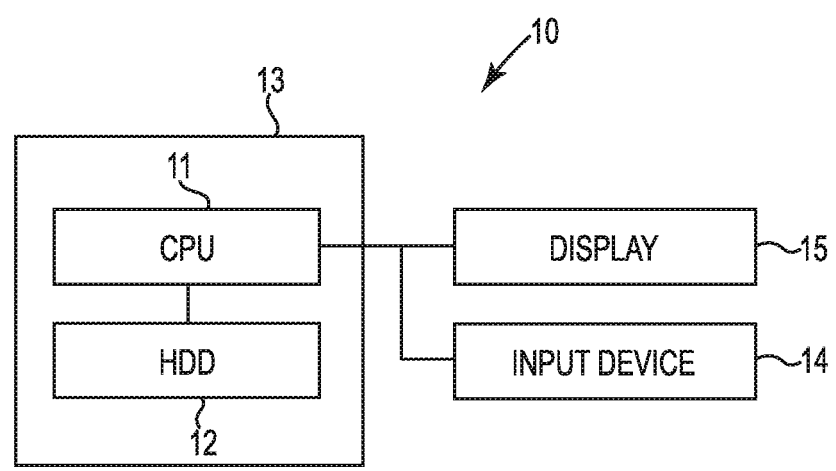
FIG. 1 is a block diagram schematically illustrating the structure of a computer apparatus.

FIG. 1 schematically illustrates the structure of a computer apparatus 10. The computer apparatus 10 includes a computer unit 13 assembled with a central processing unit (CPU) 11, and a hard disk drive (HDD) 12 as a data storage device. The CPU 11 is capable of sending and receiving information data to and from the HDD 12 in accordance with instructions input from an input device 14, such as a keyboard and/or a mouse, which is connected to the computer unit 13. The information data may be displayed on a screen of a display device 15 which is connected to the computer unit 13.

Figure 2:
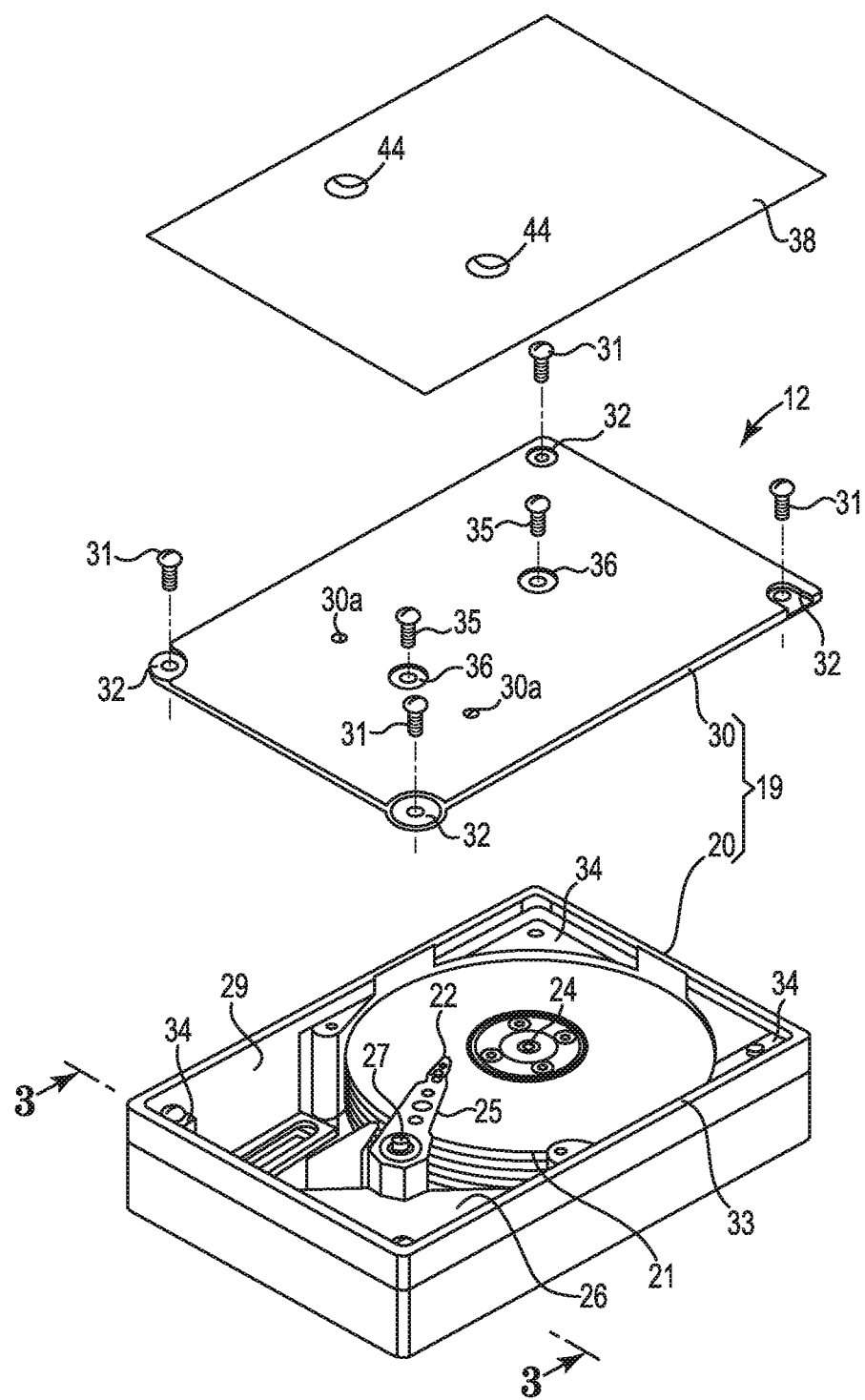
FIG. 2 is an exploded perspective view of a hard disk drive.

FIG. 2 illustrates an exploded perspective view of the HDD 12. As shown, HDD 12 includes a housing 19 having base plate 20 and top cover plate 30. As shown in FIG. 2, base plate 20 is a box-shaped housing component. The base plate 20 can be formed from a variety of materials such as metal (e.g., aluminum), plastic, and the like. In one embodiment, a metal base plate 20 can be formed by die-casting the metal into a box-shape, which can have a relatively high rigidity.

As shown, the base plate 20 can accommodate one or more magnetic disks 21 as recording media for recording information data, and magnetic heads 22 opposed to the disk surfaces of the respective recording disks 21 for reading and writing information. The recording disks 21 may rotate about a rotation axis 24 fixed to the base plate 20. The rotation of the disks 21 can be driven by a spindle motor, not shown. A carriage 25, with the magnetic head 22 at the tip end, may swing about a carriage axis 27 fixed to the base plate 20. As shown, the swinging movement of the carriage 25 is caused by a magnetic circuit 26 that includes an actuator. The magnetic heads 22 are positioned to a target recording track and block through the rotation of the disks 21 and the swinging movement of the carriage 25.

A top cover plate 30 closes a housing opening 29 of the base plate 20. The top cover plate 30 can be fastened to the base plate 20 by a variety of fasteners. As shown, top cover plate 30 can be coupled to the base plate 20 using screws 31 positioned at four corners of the top cover plate 30 so as to form the housing 19. As shown, screw receiving recesses 32 are formed at the corners of the top cover plate 30 so as to prevent the heads of the screws 31 from protruding from the level of the surface of the top cover plate 30. Steps 34 can be formed on the base plate 20 inside a housing edge 33 at the corners for receiving the screw receiving recesses 32 of the top cover plate 30. When the steps 34 receive the screw receiving recesses 32, the surface of the top cover plate 30 is leveled with the housing edge 33. Moreover, the heads of the screws 31 are prevented from protruding from the surface of the top cover plate 30.

When the top cover plate 30 is coupled to the base plate 20, two connecting screws 35 can screwed into the tip ends of the rotation axis 24 and the carriage axis 27. As shown, connecting screw receiving recesses 36 are formed in the top cover plate 30 so as to prevent the heads of the connecting screws 35 from protruding from the level of the surface of the top cover plate 30.

The top cover plate 30 may be formed by a press from a metal plate such as aluminum. The press can shape the screw receiving recesses 32 and the connecting screw receiving recesses 36 on the top cover plate 30.

A variety of polymeric elements can be applied to one or more surfaces (interior and/or exterior surfaces) of housing 19 for a variety of reasons. To facilitate heat transfer from the inside of HDD 12 to the outside of HDD 12, one or more polymeric elements can include nanofiller elements according to the present disclosure to increase the thermal conductivity of the polymeric elements and facilitate heat transfer through the polymeric element. A polymeric element can include a plurality of nanofiller elements dispersed within the polymeric matrix. Nanofiller elements can be selected to increase the thermal conductivity of the polymeric element to facilitate the transfer of heat through the polymeric element and outside of the data storage device so as to manage the temperature of the operating environment of the data storage device. Managing the temperature of the internal environment of a data storage device can help improve the life of one or more electronic components of the data storage device, help improve the performance of a data storage device, and/or help reduce power consumption due to relatively higher electrical resistance that can occur at a relatively higher operating temperature. Also, with respect to hard disk drives, managing the temperature of the internal environment of a hard disk drive can help reduce or eliminate deviations of head read/write offset due to mismatched thermal expansion of mechanical components.

As used herein, "nanofiller elements" refers to one or more of a variety of physical structures having at least one dimension less than 100 nanometers. Nanofiller elements can include one-dimensional nanofiller elements, two-dimensional nanofiller elements, three-dimensional nanofiller elements, and combinations thereof. As used herein, a "one-dimensional" nanofiller element has a thickness less than 100 nanometers. Nonlimiting examples of one-dimensional nanofiller elements include nanoplates, nanoshells, nanolaminates, and combinations thereof. As used herein, a "two-dimensional" nanofiller element has a diameter less than 100 nanometers. Nonlimiting examples of two-dimensional nanofiller elements include nanotubes, nanofibers, and combinations thereof. As used herein, a "three-dimensional" nanofiller element has all dimensions less than 100 nanometers. Nonlimiting examples of three-dimensional nanofiller elements include nanoparticles, nanobeads, and combinations thereof. Nanofiller elements can be solid or hollow structures.

Nanofiller elements can be selected for desirable thermal properties when incorporated into a polymeric matrix based on one or more of thermal conductivity, chemical composition, amount, size, form, and the like. Nanofiller elements can also be selected for desirable properties during manufacture of a polymeric element such as how readily the nanofiller elements disperse within the polymeric matrix.

The thermal conductivity of material such as a nanofiller element is a measured property that is reported in terms of Watts per (meter*Kelvin) (W/(m*K)). Thermal conductivity is indicative of the ability of a nanofiller element to conduct heat. Heat transfer occurs at a relatively higher rate for materials with a relatively higher thermal conductivity. The thermal conductivity of a nanofiller element can be measured by one or more of the following ASTM test methods: ASTM E1225-13, ASTM E2584-14, or ASTM E1530. In some embodiments, a nanofiller element can have a thermal conductivity of 5 W/(m*K) or more, 10 W/(m*K) or more, 50 W/(m*K) or more, or even 100 W/(m*K) or more according to ASTM E1225-13, ASTM E2584-14, or ASTM E1530. In some embodiments, a nanofiller element can have a thermal conductivity in the range of 10-500 W/(m*K) according to ASTM E1225-13, ASTM E2584-14, or ASTM E1530.

As mentioned, at least one factor for selecting a desirable nanofiller element includes the chemical composition of the nanofiller element. In some embodiments, the plurality of nanofiller elements include carbon nanofiller elements, metal nanofiller elements, oxide nanofiller elements, nitride nanofiller elements, carbide nanofiller elements, clay nanofiller elements, silsesquioxane nanofiller elements, and combinations thereof.

The plurality of nanofiller elements can be present in a polymeric element in an amount so that the polymeric element has desirable heat transfer properties. The thermal conductivity of a polymeric element that includes a plurality of nanofiller elements as described herein can be measured by one or more of the following ASTM test methods: ASTM D5930-16 or ASTM D 5930-01. In some embodiments, the plurality of nanofiller elements can be present in a polymeric element in an amount so that the polymeric element has a thermal conductivity greater than 0.5 W/(m*K) according to ASTM D5930-16 or ASTM D 5930-01. In some embodiments, the plurality of nanofiller elements can be present in a polymeric element in an amount so that the polymeric element has a thermal conductivity in the range from 1 to 20 W/(m*K) according to ASTM D5930-16 or ASTM D 5930-01. In some embodiments, the plurality of nanofiller elements can be present in a polymeric element in an amount from 0.1 to 10 percent by weight of the polymeric element, from 0.5 to 10 percent by weight of the polymeric element, from 1 to 10 percent by weight of the polymeric element, or even from 2 to 10 percent by weight of the polymeric element.

Optionally, a polymeric matrix according to the present disclosure can include one or more additional components such as pigments, anti-bacteria agents, combinations of these, and the like.

A wide variety of polymers can be used as a polymeric matrix according to the present disclosure. Non-limiting examples of polymers include acrylonitrile-butadiene-styrene, acrylics, acetal (polyoxymethylene), cellulose acetate, diallyl phthalate, epoxy, ethylcellulose, ethylvinylacetate, phenolic, polyamide, polycarbonate, polytetrafluorethylene, polyethylene terephthalate, polyimide, polypropylene, polyester, polyurethane, polyvinylchloride, and combinations thereof.

A plurality of nanofiller elements can be combined with a polymer to form a polymeric element composed of the nanofiller elements dispersed within a polymeric matrix using a variety of techniques. In some embodiments, a plurality of nanofiller elements as described herein can be combined with one or more polymers as described herein via industrial methods such as plastic compounding, direct melting-compounding, intercalation, in-situ polymerization, sol-gel, direct mixing of polymer and nanofiller elements, combinations of these, and the like.

Optionally, one or more surfaces of the nanofiller elements can be treated so that the nanofiller elements interact desirably with the polymeric matrix to facilitate blending the nanofiller elements with the polymer and obtain a desired dispersion. For example, one or more of chemical treatment, radiation treatment, and the like can be applied to surfaces of the nanofiller elements before being combined with the polymeric matrix. In some embodiments, a plurality of nanofiller elements can be uniformly dispersed throughout the polymeric matrix. In other embodiments, a plurality of nanofiller elements can be relatively concentrated near relatively higher heat intensive areas (e.g., around the spindle motor).

Data storage devices such as HDDS include a wide variety of polymeric elements that can include a plurality of nanofiller elements according to the present disclosure. Nonlimiting examples of polymeric elements that can be present on a surface of a HDD housing include an adhesive layer, a polymeric film, a composite structure than includes a polymeric film and/or an adhesive layer, a gasket, and combinations thereof.

An example of a polymeric element in the form of a composite structure having a polymeric film and an adhesive layer is to as a "cover seal." Referring to FIG. 2 for illustration purposes, a cover seal 38 can help fasten or fix the top cover plate 30 to the base plate 20. A cover seal can also help fasten or fix one or more elements (e.g., hole filling film (not shown)) to HDD 12. Further, a cover seal can help seal (e.g., "hermetically seal") one or more passages in HDD 12 to hinder or prevent the passage of a gas such as air from the inside of HDD 12 to the outside of HDD 12, and vice versa.

When the attachment of the top cover plate 30 is completed, the cover seal 38 can be adhered to the outer surface of the housing 19. As shown, the cover seal 38 not only covers all over the surface of the top cover plate 30 but also extends to the edge 33 of the base plate 20. A seam between the edge 33 and the top cover plate 30 can be air-tightly sealed by the cover seal 38. When the cover seal 38 is adhered all along the edge 33, the top cover plate 30 can be enclosed in the cover seal 38 and the base plate 20. As shown, the heads of the screws 31 in the screw receiving recesses 32 and the heads of the connecting screws 35 in the connecting screw receiving recesses 36 are positioned inside the cover seal 38.

Optionally, as also shown in FIG. 2, inspection holes 44 may be included in the cover seal 38. Communication holes 30a can formed in the top cover plate 30 corresponding to the inspection holes 44. These inspection holes 44 and communication holes 30a can be used when the air-tightness of the housing 19 is examined. For example, examination can be conducted by first blowing air into the housing 19 through the inspection holes 44 and communication holes 30a and then detecting a leakage of air from the periphery of the top cover plate 30 and the vicinity of the screws 31 and the connecting screws 35. The communication holes 30a may be sealed by a seal member after the examination. The examination may be conducted during or after the assembling process of the HDD 12.

In some embodiments, a cover seal can include at least a polymeric backing film and an adhesive. Note that prior to application of a cover seal to a surface of an HDD, the cover seal may include a release liner, which can include a release liner film and release agent (e.g., a silicon-free release liner).

A variety of polymeric backing films may be used in a cover seal. Non-limiting examples of polymeric backing films includepolyethylene terephthalate (PET) film, cellulose acetate film, polyamide film, polyimide film, polycarbonate film, polyurethane film, polyester film, polypropylene film, polytetrafluorethylene film, combinations of these, and the like. A variety of thicknesses may be used for one or more polymeric backing films (e.g., PET backing film) used in a cover seal. In some embodiments, a polymer backing film may have a thickness in the range from 1 micrometer to 40 micrometers, from 5 micrometers to 30 micrometers, or even from 5 micrometers to 15 micrometers.

A variety of adhesives may be used in a cover seal. A non-limiting class of adhesives can be referred to as viscoelastic adhesives. Non-limiting examples of viscoelastic adhesives include acrylic copolymers, natural or synthetic rubber, resin, silicone, and combinations thereof. In some embodiments, an adhesive can be a single polymer system. In other embodiments, an adhesive can be a blended polymer system. Optionally, an adhesive can include one or more additives. A variety of thicknesses may be used for one or more adhesives used in a cover seal. In some embodiments, an adhesive layer may have a thickness in the range from 10 micrometer to 100 micrometers, from 15 micrometers to 80 micrometers, or even from 20 micrometers to 70 micrometers.

One or more nanofiller elements as described above can be incorporated into a polymeric backing film and/or an adhesive of a cover seal so as to provide a desirable thermal conductivity of the backing film and/or adhesive, respectively. In some embodiments, a cover seal that includes a plurality of nanofiller elements as described herein can have a thermal conductivity of 0.5 W/(m*K) or greater. In some embodiments, a cover seal that includes a plurality of nanofiller elements as described herein can have a thermal conductivity from 0.5 to 10 W/(m*K), or even from 1 to 5 W/(m*K).

Optionally, one or more additional layers can be included in a cover seal composite structure. A nonlimiting example of an additional layer includes a metal layer such as aluminum. A metal layer can help mold the cover seal so as to conform to the housing of an HDD. The metal layer can also help transfer heat away from the interior of an HDD. In some embodiments, an aluminum layer can have a thickness from 1 to 20 micrometers, or even from 5 to 10 micrometers.

Figure 3:
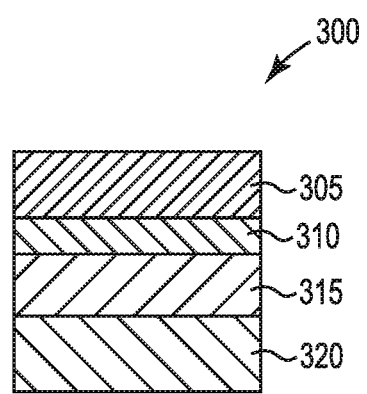
FIG. 3 is a schematic, partial, cross-sectional view of a cover seal.

A nonlimiting example of a cover seal structure is shown in FIG. 3. As shown, cover seal 300 includes PET layer 305, aluminum layer 310, adhesive layer 315, and silicone-free release liner 320.

Figure 4:
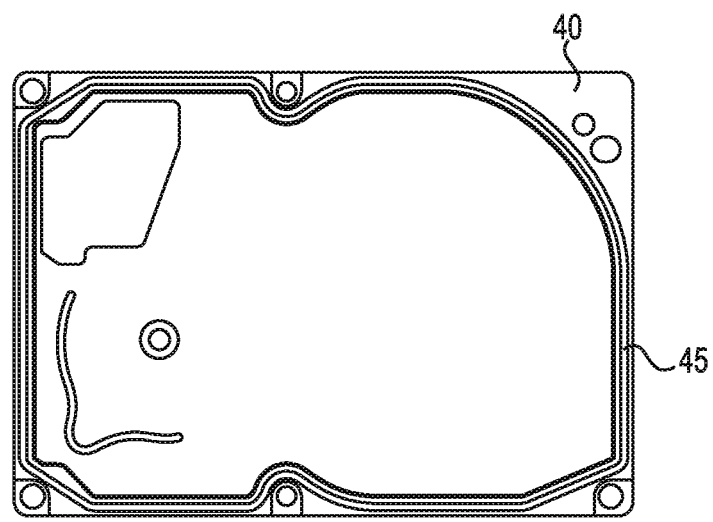
FIG. 4 is a bottom view of a cover plate that includes a form-in-place-gasket.

An example of a polymeric element in the form of a gasket is a form-in-place-gasket (FIPG). Referring to FIG. 4 for illustration purposes, a FIPG 45 is present on the interior side of a top cover plate 40 (similar to top cover plate 30 in FIG. 3). FIPG 45 can contact the rim of a HDD base plate so as to help seal the housing of a HDD when the top cover plate 40 is mounted to a base plate.

A FIPG can be formed from a wide variety of curable polymers. In some embodiments, a FIPG can be made from one or two part UV curable epoxy resins, a fluoroelastomer such as fluorinated amide or fluorinated organohydrogensiloxane, rubbers such as polyorganosiloxane, combinations of these, and the like. One or more nanofiller elements as described above can be incorporated into a FIPG before the FIPG is cured. In some embodiments, one or more nanofiller elements as described above can be incorporated into a FIPG by stirring and mixing.

One or more nanofiller elements as described above can be incorporated into a FIPG in an amount so as to provide a desirable thermal conductivity of the FIPG. In some embodiments, a FIPG that includes a plurality of nanofiller elements as described herein can have a thermal conductivity of 0.5 W/(m*K) or greater. In some embodiments, a FIPG that includes a plurality of nanofiller elements as described herein can have a thermal conductivity from 0.5 to 10 W/(m*K), or even from 1 to 5 W/(m*K).

Figure 5:
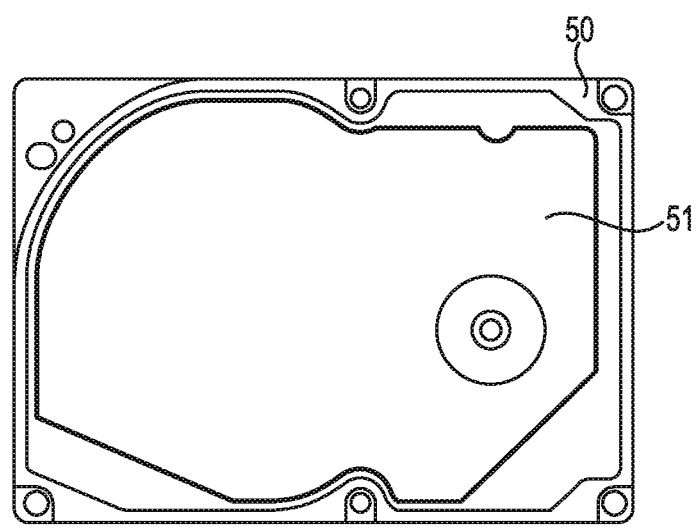
FIG. 5 is a top view of a cover plate that includes a product label.

An example of a polymeric element in the form of a composite structure having a polymeric film and an adhesive layer is to as a "product label." Referring to FIG. 5 for illustration purposes, a product label 51 is present on the exterior side of a top cover plate 50 (similar to top cover plate 30 in FIG. 3). Product label 51 can include text and the like (not shown) to identify the HDD.

A product label can include a facestock film and an adhesive for applying the facestock film to a top cover plate. The facestock film can include the text portion of the product label. The facestock film can be single or multi-layer structure that includes paper and/or plastic. A wide variety of polymers can be used as the polymeric, facestock film. In some embodiments, the polymeric, facestock film can include PET. A plurality of nanofiller elements can be incorporated onto and/or into a facestock film by spraying, pressing, rolling, mixing combinations of these, and the like. In some embodiments, a plurality of nanofiller elements can be incorporated onto and/or into a polymeric facestock film by rolling the facestock film over the plurality of nanofiller elements. In some embodiments, the plurality of nanofiller elements can be mixed into a polymer before the polymer is cured. Optionally, a facestock film can be laminated with one or more metal films.

A variety of adhesives may be used in a product label. A non-limiting class of adhesives can be referred to as viscoelastic adhesives. Non-limiting examples of viscoelastic adhesives include acrylic copolymers, natural or synthetic rubber, resin, silicone, and combinations thereof. In some embodiments, an adhesive can be a single polymer system. In other embodiments, an adhesive can be a blended polymer system. Optionally, an adhesive can include one or more additives. A variety of thicknesses may be used for one or more adhesives used in a product label. In some embodiments, an adhesive layer may have a thickness in the range from 10 micrometer to 100 micrometers, from 15 micrometers to 80 micrometers, or even from 20 micrometers to 70 micrometers.

One or more nanofiller elements as described above can be incorporated into a polymeric, facestock film and/or an adhesive of a product label so as to provide a desirable thermal conductivity of the polymeric, facestock film and/or adhesive, respectively. In some embodiments, a product label that includes a plurality of nanofiller elements as described herein can have a thermal conductivity of 0.5 W/(m*K) or greater. In some embodiments, a product label that includes a plurality of nanofiller elements as described herein can have a thermal conductivity from 0.5 to 10 W/(m*K), or even from 1 to 5 W/(m*K).

What is claimed is:

1. A data storage device housing component comprising a polymeric element attached to a surface of the data storage device housing component, wherein the polymeric element comprises:
   a) a polymeric matrix; and
   b) a plurality of nanofiller elements dispersed within the polymeric matrix, wherein the plurality of nanofiller elements are present in the polymeric element in an amount so that the polymeric element has a thermal conductivity greater than 0.5 W/(m*K) according to ASTM D5930-16 or ASTM D 5930-01, and wherein the plurality of nanofiller elements have an average particle size of less than 100 nanometers.

2. The data storage device housing component of claim 1, wherein the polymeric element is selected from the group consisting of an adhesive layer, a polymeric film, a gasket, and combinations thereof, and wherein the plurality of nanofiller elements are selected from the group consisting of carbon nanofiller, metal nanofiller, oxide nanofiller, nitride nanofiller, carbide nanofiller, clay nanofiller, silsesquioxane nanofiller, and combinations thereof.

3. A data storage device housing component comprising a polymeric element attached to a surface of the data storage device housing component, wherein the data storage device housing component is chosen from a hard disk drive housing component, a solid state drive housing component and combinations thereof and wherein the polymeric element comprises:
   a) a polymeric matrix; and
   b) a plurality of nanofiller elements dispersed within the polymeric matrix, wherein the plurality of nanofiller elements have an average particle size of less than 100 nanometers.

4. The data storage device housing component of claim 3, wherein the plurality of nanofiller elements have a thermal conductivity of 5 W/(m*K) or more according to ASTM E1225-13, ASTM E2584-14, or ASTM E1530.

5. The data storage device housing component of claim 3, wherein the data storage device housing component comprises a hard disk drive housing component.

6. The data storage device housing component of claim 5, wherein the polymeric element is selected from the group consisting of an adhesive layer, a polymeric film, a gasket, and combinations thereof.

7. The data storage device housing component of claim 5, wherein the polymeric element is selected from the group consisting of a cover seal, a product label, a FIPG (Form-in-Place-Gasket), and combinations thereof.

8. The data storage device housing component of claim 3, wherein the plurality of nanofiller elements are present in the polymeric element in an amount in the range from 0.1 to 10 percent by weight of the polymeric element.

9. The data storage device housing component of claim 3, wherein the plurality of nanofiller elements are selected from the group consisting of carbon nanofiller, metal nanofiller, oxide nanofiller, nitride nanofiller, carbide nanofiller, clay nanofiller, silsesquioxane nanofiller, and combinations thereof.

10. The data storage device housing component of claim 3, wherein the plurality of nanofiller elements have a thermal conductivity in the range of 10-500 W/(m*K) according to ASTM E1225-13, ASTM E2584-14, or ASTM E1530.

11. The data storage device housing component of claim 3, wherein the plurality of nanofiller elements are selected from the group of nanoplates, nanoshells, nanolaminates, nanotubes, nanofibers, nanobeads, and combinations thereof.

12. A data storage device comprising a hard disk drive, wherein the hard disk drive comprises a housing, wherein the housing comprises a base plate, a top cover fastened to the base plate, and polymeric element attached to a surface of the top cover plate, wherein the polymeric element comprises:
   a) a polymeric matrix; and
   b) a plurality of nanofiller elements dispersed within the polymeric matrix, wherein the plurality of nanofiller elements are present in the polymeric element in an amount so that the polymeric element has a thermal conductivity greater than 0.5 W/(m*K) according to ASTM D5930-16 or ASTM D 5930-01.

13. The data storage device of claim 12, wherein the plurality of nanofiller elements have a thermal conductivity of 5 W/(m*K) or more according to ASTM E1225-13, ASTM E2584-14, or ASTM E1530.

14. The data storage device of claim 12, wherein the polymeric element is selected from the group consisting of an adhesive layer, a polymeric film, a gasket, and combinations thereof.

15. The data storage device of claim 12, wherein the plurality of nanofiller elements are selected from the group consisting of carbon nanofiller, metal nanofiller, oxide nanofiller, nitride nanofiller, carbide nanofiller, clay nanofiller, silsesquioxane nanofiller, and combinations thereof.

16. A data storage device comprising a housing, wherein the data storage device is chosen from a hard disk drive, a solid state drive, and combinations thereof, and wherein the housing comprises a polymeric element attached to a surface of the housing, wherein the polymeric element comprises:

a) a polymeric matrix; and
b) a plurality of nanofiller elements dispersed within the polymeric matrix, wherein the plurality of nanofiller elements have an average particle size of less than 100 nanometers.

17. The data storage device of claim 16, wherein the plurality of nanofiller elements have a thermal conductivity in the range of 10-500 W/(m*K) according to ASTM E1225-13, ASTM E2584-14, or ASTM E1530.

18. The data storage device of claim 16, wherein the polymeric element is selected from the group consisting of an adhesive layer, a polymeric film, a gasket, and combinations thereof, and wherein the plurality of nanofiller elements are selected from the group consisting of carbon nanofiller, metal nanofiller, oxide nanofiller, nitride nanofiller, carbide nanofiller, clay nanofiller, silsesquioxane nanofiller, and combinations thereof.

* * * * *